US009190480B2

(12) United States Patent
Siemieniec et al.

(10) Patent No.: US 9,190,480 B2
(45) Date of Patent: Nov. 17, 2015

(54) METHOD AND CONTACT STRUCTURE FOR COUPLING A DOPED BODY REGION TO A TRENCH ELECTRODE OF A SEMICONDUCTOR DEVICE

(71) Applicant: Infineon Technologies Austria AG, Villach (AT)

(72) Inventors: Ralf Siemieniec, Villach (AT); Li Juin Yip, Villach (AT); Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/136,532

(22) Filed: Dec. 20, 2013

(65) Prior Publication Data
US 2015/0179752 A1   Jun. 25, 2015

(51) Int. Cl.
H01L 29/02 (2006.01)
H01L 29/66 (2006.01)
H01L 21/70 (2006.01)
H01L 21/336 (2006.01)
H01L 29/45 (2006.01)
H01L 21/285 (2006.01)
H01L 21/768 (2006.01)

(52) U.S. Cl.
CPC ........ H01L 29/456 (2013.01); H01L 21/28518 (2013.01); H01L 21/76841 (2013.01)

(58) Field of Classification Search
None
See application file for complete search history.

(56) References Cited

U.S. PATENT DOCUMENTS

| 8,080,858 B2 | 12/2011 | Hirler et al. | |
| 8,558,308 B1 | 10/2013 | Blank et al. | |
| 2007/0197029 A1* | 8/2007 | Halimaoui | 438/658 |
| 2007/0249077 A1* | 10/2007 | Sze et al. | 438/48 |
| 2009/0090967 A1* | 4/2009 | Chen et al. | 257/330 |
| 2011/0291186 A1* | 12/2011 | Yilmaz et al. | 257/334 |
| 2012/0043602 A1* | 2/2012 | Zeng et al. | 257/330 |
| 2012/0153386 A1 | 6/2012 | Hirler et al. | |

FOREIGN PATENT DOCUMENTS

DE   102006036347 B4   1/2012

* cited by examiner

Primary Examiner — Calvin Choi
Assistant Examiner — Xiaoming Liu
(74) Attorney, Agent, or Firm — Murphy, Bilak & Homiller, PLLC

(57) ABSTRACT

A semiconductor body has a first surface, a second opposing surface, an edge, an active device region, and an edge termination region. A trench extends from the first surface into the semiconductor body in the edge termination region and includes sidewalls and an insulated electrode. A first conductivity type doped region extends from the first surface into the semiconductor body in the edge termination region and has a planar outer surface along the first surface that adjoins the trench at a corner of the trench sidewall and the first surface and has a side surface extending from the corner along the trench sidewall. A first interconnect contacts the trench electrode. A second interconnect contacts the outer surface and the side surface. A contact couples the first doped region to the trench electrode and has a bottom surface coplanar with the first surface from a contact edge to the corner.

20 Claims, 14 Drawing Sheets

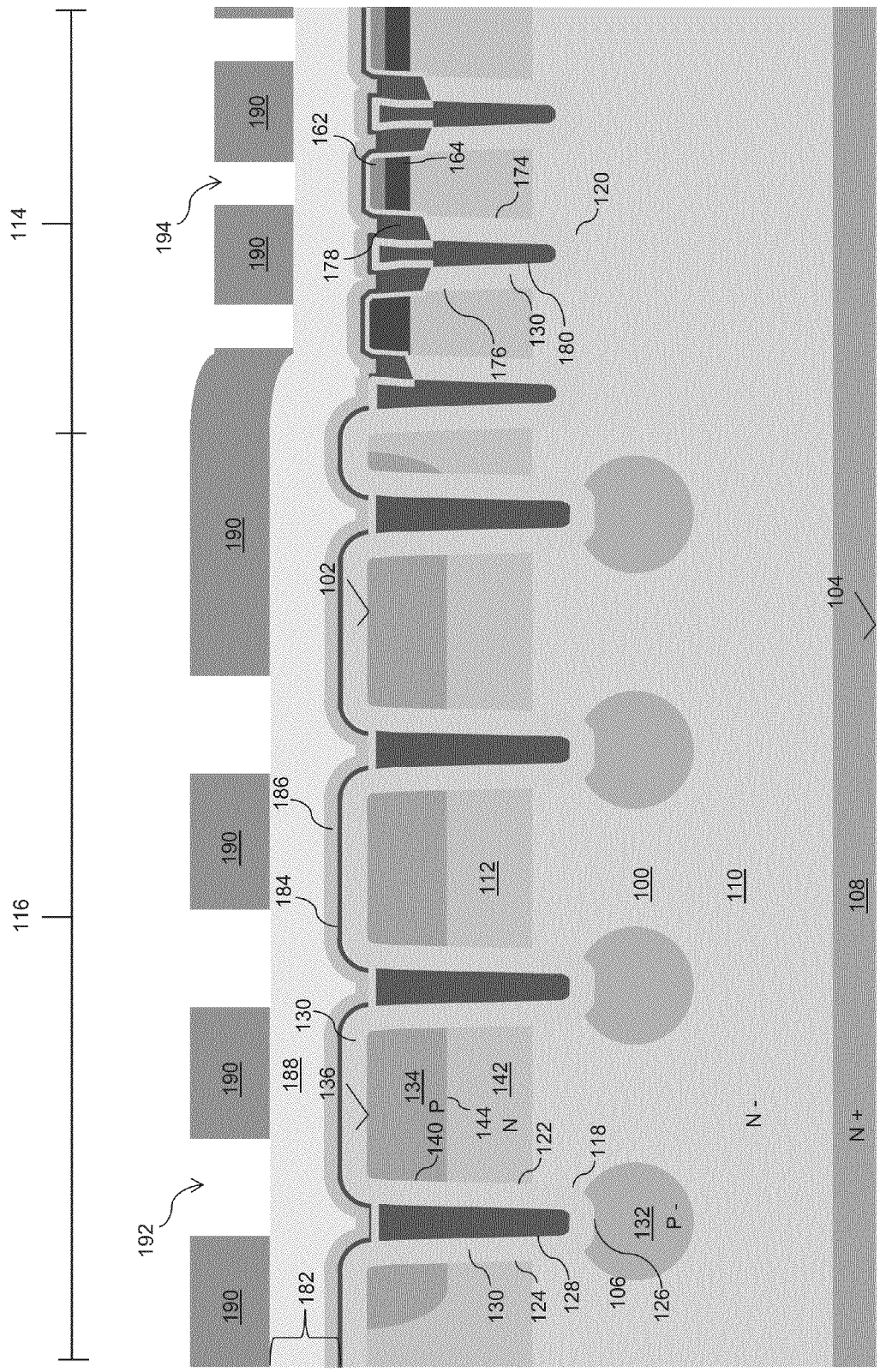

METHOD AND CONTACT STRUCTURE FOR COUPLING A DOPED BODY REGION TO A TRENCH ELECTRODE OF A SEMICONDUCTOR DEVICE

TECHNICAL FIELD

The present invention generally relates to edge termination structures for semiconductor devices, and particularly relates to contacts for electrically coupling electrodes in an edge termination trench of a semiconductor device to a doped body region of the device.

BACKGROUND

Power semiconductor devices are commonly required to achieve a high reverse voltage blocking capability. Some applications require power semiconductor devices to withstand reverse voltages of 200 volts or greater.

Edge termination structures have been incorporated into power semiconductor devices to improve reverse voltage blocking capability. Edge termination structures typically surround the active device region that includes the power semiconductor devices, and may be near the edge of the substrate. Edge termination structures mitigate avalanche breakdown, and hence improve reverse voltage blocking capability, by redirecting equipotential lines within the drift region of the device toward the main surface and away from the edge of the substrate.

Edge termination structures may include trenches having buried electrodes that are electrically connected to a doped region adjacent the trench and at the surface of the substrate. This adjacent doped region forms a p-n junction with an oppositely doped subjacent region. Typically, the connection between the buried electrode and the adjacent doped region is provided by a contact that is formed over the buried electrode and in a recessed portion of the adjacent semiconductor substrate. A silicide layer or other conductive material may be provided in the recessed portion between the contact and the semiconductor to improve electrical connectivity. Because of the recess, the silicide layer is spaced close to the p-n junction. Subsequent thermal processing of the device, e.g. due to platinum diffusion for lifetime carrier reduction, inter-layer dielectric deposition, etc., causes the silicide layer to diffuse deeper into the semiconductor body toward the second doped region. If the silicide layer diffuses deep enough it will short the p-n junction between the first and second doped regions, causing substantial leakage. Devices with high leakage are discarded, reducing yield.

SUMMARY

The present invention comprises an apparatus and method for coupling a doped body region to a trench electrode.

According to an embodiment, a semiconductor device includes a semiconductor body comprising a first surface, a second surface opposite the first surface, an edge extending between the first and second surfaces, an active device region spaced inward from the edge and comprising at least one active semiconductor device, and an edge termination region between the active device region and the edge. A trench extends from the first surface into the semiconductor body in the edge termination region. The trench includes sidewalls and an electrode insulated from the surrounding semiconductor body. A first doped region of a first conductivity type extends from the first surface into the semiconductor body in the edge termination region. The first doped region has a planar outer surface disposed along the first surface that adjoins one of the trench sidewalls at a corner of the trench sidewall and the first surface and a side surface extending from the corner along the trench sidewall. A first interconnect contacts the trench electrode. A second interconnect contacts the outer surface and the side surface of the first doped region. An edge region contact contacts the first and second interconnects and electrically couples the first doped region to the trench electrode. The edge region contact has a bottom surface that is coplanar with the first surface from an edge of the edge region contact to the corner.

According to an embodiment, a method of forming a semiconductor device in a semiconductor body comprising a first surface, a second surface opposite the first surface, an edge extending between the first and second surfaces, an active device region spaced inward from the edge and comprising at least one active semiconductor device, and an edge termination region between the active device region and the edge is disclosed. The method includes forming a trench extending from the first surface into the semiconductor body in the edge termination region, the trench comprising sidewalls and an electrode insulated from the surrounding semiconductor body. A first doped region of a first conductivity type is formed extending from the first surface into the semiconductor body in the edge termination region. The first doped region has a planar surface disposed along the first surface that adjoins one of the trench sidewalls at a corner of the trench sidewall and the first surface and a side surface extending from the corner along the trench sidewall. A first interconnect contacting the trench electrode is formed. A second interconnect contacting the outer surface and the side surface of the first doped region is formed. An edge region contact adjacent to the first and second interconnects and electrically coupling the first doped region to the trench electrode is formed. The edge region contact has a bottom surface that is coplanar with the first surface from an edge of the edge region contact to the corner.

Of course, the present invention is not limited to the above features and advantages. Indeed, those skilled in the art will recognize additional features and advantages upon reading the following detailed description, and upon viewing the accompanying drawings.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

FIG. 3, which includes FIGS. 3A through 3L, illustrates an embodiment of a method of forming a semiconductor device having an edge termination region and an active device region, the edge termination region having an edge termination trench electrode and surface contact.

DETAILED DESCRIPTION

According to embodiments described herein, a semiconductor device is provided that has an active device region formed in a semiconductor body and an edge termination region between the active device region and the edge of the semiconductor body. The edge termination region includes one or more trenches each with a trench electrode electrically connected by an edge region contact to a first doped region at the surface of the semiconductor body. The first doped region is not recessed, but instead has a planar outer surface disposed along the main surface of the semiconductor that adjoins one of the trench sidewalls at a corner of the trench sidewall. The first doped region also has a side surface extending from the corner along the trench sidewall. A silicide such as TiSi is disposed along the planar outer surface and the side surface of the first doped region, and on the trench electrode. The silicide disposed on the side surface of the first doped region is maximally separated from the p-n junction between the first doped region and a second oppositely doped region under the first doped region, because the first doped region is not recessed. An edge region contact electrically couples the first doped region to the trench electrode, and has a bottom surface that is coplanar with the main surface of the semiconductor body from an edge of the edge region contact to the corner of the trench sidewall.

Figure 1:
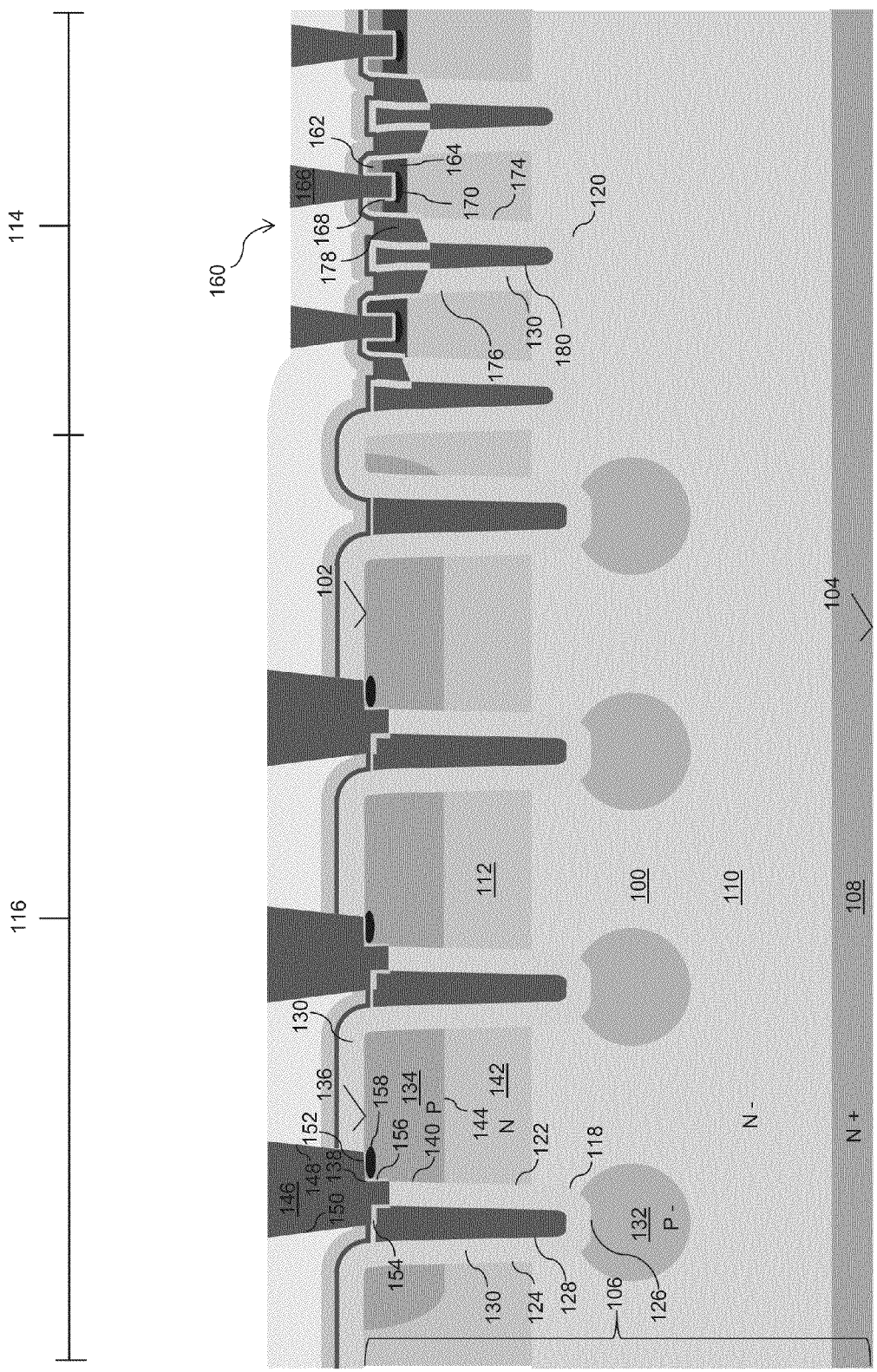
FIG. 1 illustrates a cross sectional view of a semiconductor device having an edge termination region with an edge termination trench electrode and surface contact, according to an embodiment.

FIG. 1 shows an embodiment of the semiconductor device. The semiconductor device includes a semiconductor body 100 having a first surface 102, a second surface 104 that is opposite the first surface, and an edge 106 extending between the first and second surfaces. The semiconductor body 100 further includes first, second and third semiconductors layers 108, 110 and 112. The first semiconductor layer 108 may be a silicon substrate having a second conductivity type. The second semiconductor layer 110 may be an epitaxial layer that is lightly doped with dopants of the second conductivity type. The third semiconductor layer 112 may also be an epitaxial layer that is doped higher than the second semiconductor layer 110 with dopants of the second conductivity type.

The first conductivity type may be the p type and the second conductivity type may be the n type as illustrated in the figures. According to other embodiments, the first conductivity type may be the n type and the second conductivity type may be the p type. Outside the illustrated portions, the semiconductor body may include further impurity zones, intrinsic zones, as well as dielectric and conductive structures that may be configured to form electronic components or circuits.

An active device region 114 and an edge termination region 116 are formed in the semiconductor body 100, with the edge termination region 116 disposed between the active device region 114 and the edge 106 of the semiconductor body 100. One or more edge termination trenches 118 are arranged in the edge termination region 116. Active device trenches 120 are arranged in the active device region 114. Each edge termination trench 118 and active device trench 120 extends from the first surface 102 into the semiconductor body 100. According to an embodiment, the edge termination trench 118 and the active device trench 120 have the same dimensions. According to another embodiment, the edge termination trench 118 is deeper and wider than the active device trench 120.

The edge termination trench 118 has sidewalls 122, 124 and a bottom 126. An edge termination electrode 128 is arranged within the edge termination trench 118 and is insulated from the surrounding semiconductor body 100 by a dielectric 130. According to an embodiment, the dielectric 130 is an oxide, such as silicon dioxide ($SiO_2$). An edge zone 132 is arranged beneath the edge termination trench 118 and adjoins the bottom 126. The edge zone 132 may be a first conductivity type doped region that is lightly doped. The doping concentration of the edge zone 132 may be selected such that the edge zone 132 is completely depleted or so that the non-depleted portion of the edge zone 132 is smaller than a width of the edge termination trench 118. According to an embodiment, the integrated doping concentration of first type dopants in the edge zone 132 along a lateral direction that is parallel to the first surface 102 is substantially equal to the integrated doping concentration of second type dopants in the second semiconductor layer 110 along a lateral direction that is parallel to the first surface 102 between adjacent ones of the edge zones 132.

A first doped region 134 having a first conductivity type that is opposite the second conductivity type is arranged in the semiconductor body 100 adjacent the edge termination trench 118. The first doped region 134 has a planar outer surface 136 disposed along the first surface 102. The planar outer surface 136 adjoins the edge termination trench 118 at a corner 138 of one of the trench sidewalls 122. The first doped region 134 additionally has a side surface 140 that extends form the corner 138 along that trench sidewall 122. In other words, there is no recess in the first doped region 134 adjacent to the edge termination trench 118.

A second doped region 142 is arranged below the first doped region 134. The second doped region 142 has a second conductivity type that is opposite the first conductivity type. The second doped region 142 may be provided from and have the same doping concentration as the second semiconductor layer 110. The second doped region 142 adjoins the first doped region 134 to form a p-n junction 144. The p-n junction 144 extends beneath the first surface 102 and terminates at the trench sidewall 122 that adjoins the first doped region 134.

According to an embodiment, the edge termination region 116 includes a plurality of edge termination trenches 118. In this embodiment, the planar outer surface 136 of the first doped region(s) 134 extends between adjacent ones of the edge termination trenches 118. In other words, adjacent ones of the edge termination trenches 118 form a semiconductor mesa in the semiconductor body 100 that is defined by the first surface 102 and the trench sidewalls 122, 124 of the adjacent edge termination trenches 118. The first doped region 134 is arranged at the top of each semiconductor mesa between adjacent ones of the edge termination trenches 118.

The first doped region 134 is electrically coupled to the edge termination electrode 128 by an edge region contact 146. The edge region contact 146 may be made of highly doped polysilicon. The edge region contact 146 has outer edges 148, 150 that extend over the first doped region 134 and the edge termination electrode 128, respectively. The edge region contact 146 has a bottom surface 152 that is coplanar with the first surface 102 from the outer edge 148 of the edge region contact 146 over the first doped region 134 to the corner 138. In other words, the edge region contact 146 does not extend into the first surface 102 in lateral region that begins at the corner 138 and extends away from the edge termination trench 118. This is because the first doped region 134 is not recessed adjacent the edge termination trench 118.

The edge region contact 146 may be formed in a single opening of an insulating layer that is arranged on the first surface 102. For example, as shown in FIG. 1, a layer of dielectric 130 is arranged on the first surface 102. This layer includes a single opening over the edge termination electrode 128 and the first doped region 134 in which the edge region contact 146 is disposed. Further, the single opening extends into the dielectric 130 between the edge termination electrode 128 and the trench sidewall 122 adjacent the first doped region 134. That is, the dielectric 130 in the edge termination trench 118 is recessed adjacent the first doped region 134 and the edge region contact 146 extends beneath the first surface 102 and beneath the top of the edge termination electrode 128 into the recessed portion of the dielectric 130.

First and second interconnects 154, 156 may be used to provide a low-resistance electrical connection between the first doped region 134 and the edge termination electrode 128. The first interconnect 154 contacts the edge termination electrode 128 and the edge region contact 146. The second interconnect 156 contacts the edge region contact 146 and the first doped region 134. The first and second interconnects 154, 156 may be formed from one or more conductors, such as, titanium (Ti), titanium silicide (TiSi) and the like.

The electrical connection between the first doped region 134 and the edge termination electrode 128 may be further improved by a heavily doped (e.g. p++ in the case of a p-doped region 134) contact region 158 in the first doped region 134. The heavily doped contact region 158 has the same doping type as the first doped region 134 (i.e. first conductivity type) and is more heavily doped than the surrounding portions of the first doped region 134. The heavily doped contact region 158 provides a substantially low ohmic connection between the edge termination electrode 128 and the first doped region 134.

At least one active device 160 is arranged in the active device region 114. The active device 160 may be, for example, a vertical MOSFET transistor configured to control a current flowing in a vertical direction perpendicular to the first and second surfaces 102, 104. As shown in FIG. 1, a source region 162 of the second conductivity type is provided in the active device region 114 extending from the first surface 102 into the semiconductor body 100. A body region 164 of the first conductivity type is provided in the active device region 114 beneath the source region 162. A drift region of the active device 160 may be formed from the lightly doped second semiconductor layer 110. The first semiconductor layer 108 may provide a drain for the active device 160.

An electrical connection to the source region 162 may be provided by a source contact 166. The source contact 166 may be formed from highly doped polysilicon. The source contact 166 is formed in a grove that extends into the semiconductor body 100, beneath the first surface 102. Optionally, the source contact 166 may extend into the body region 164 so that the source region 162 and body region 164 may be tied to the same potential. The electrical connection between the source region 162, body region 164 and source contact 166 may be enhanced by a third interconnect 168. The third interconnect 168 contacts the source region 162, body region 164 and the source contact 166, and may be formed from the same material as the first and second interconnects 154, 156. A body contact region 170 may be formed in the body region 164 adjacent the third interconnect 168. The body contact region 170 has the same doping type and is more heavily doped than surrounding portions of the body region 164. A drain contact (not shown) may be provided adjacent the first semiconductor layer 108 to provide a drain potential to the active device 160.

The active device trench 120 is provided in the active device region 114 adjacent to the source and body regions 162, 164. The active device trench 120 has sidewalls 174, 176 that extend from the first surface 102 into the semiconductor body 100. A gate electrode 178 is arranged in the active device trench 160 and is insulated from the semiconductor body 100 by the dielectric 130. The dielectric 130 may be an oxide and may be part of the same oxide layer that is used to form the dielectric 130 in the edge termination trench 118. Optionally, a field electrode 180 is arranged in the active device trench 120. The field electrode 180 is dielectrically insulated from the semiconductor body 100 by the dielectric 130 and is adjacent the drift region of the active device 160.

The active device 160 controls current flow by the application of a suitable potential to the gate electrode 178. A suitably biased gate electrode 178 controls a channel in the body region 164 and provides a conduction path (or lack thereof) between the source region 162 and the drain of the device.

The edge termination trenches 118 and associated regions within the edge termination region 116 are configured to mitigate (i.e. avoid) avalanche breakdown in the edge termination region 116. In other words, edge termination trenches 118 and associated regions within the edge termination region 116 are configured so that avalanche breakdown occurs, if at all, in the active device region 114. As the active device 160 is reverse biased, an electric field develops across the semiconductor body 100 in a lateral direction. A suitable bias applied to the edge termination trench electrode 128 bends the equipotential lines of the electric field away from the edge 106 and towards the first surface 102. Advantageously, a significant amount of the equipotential is absorbed by the dielectric 130 in the edge termination trench 118. The lightly doped edge zones 132 are completely or substantially depleted. Consequently, much of the abrupt curvature in the equipotential lines is relegated to these depleted areas. Thus, areas of high potential gradient are relegated to regions devoid of charge carriers that may cause or contribute to avalanche breakdown.

Figure 2:
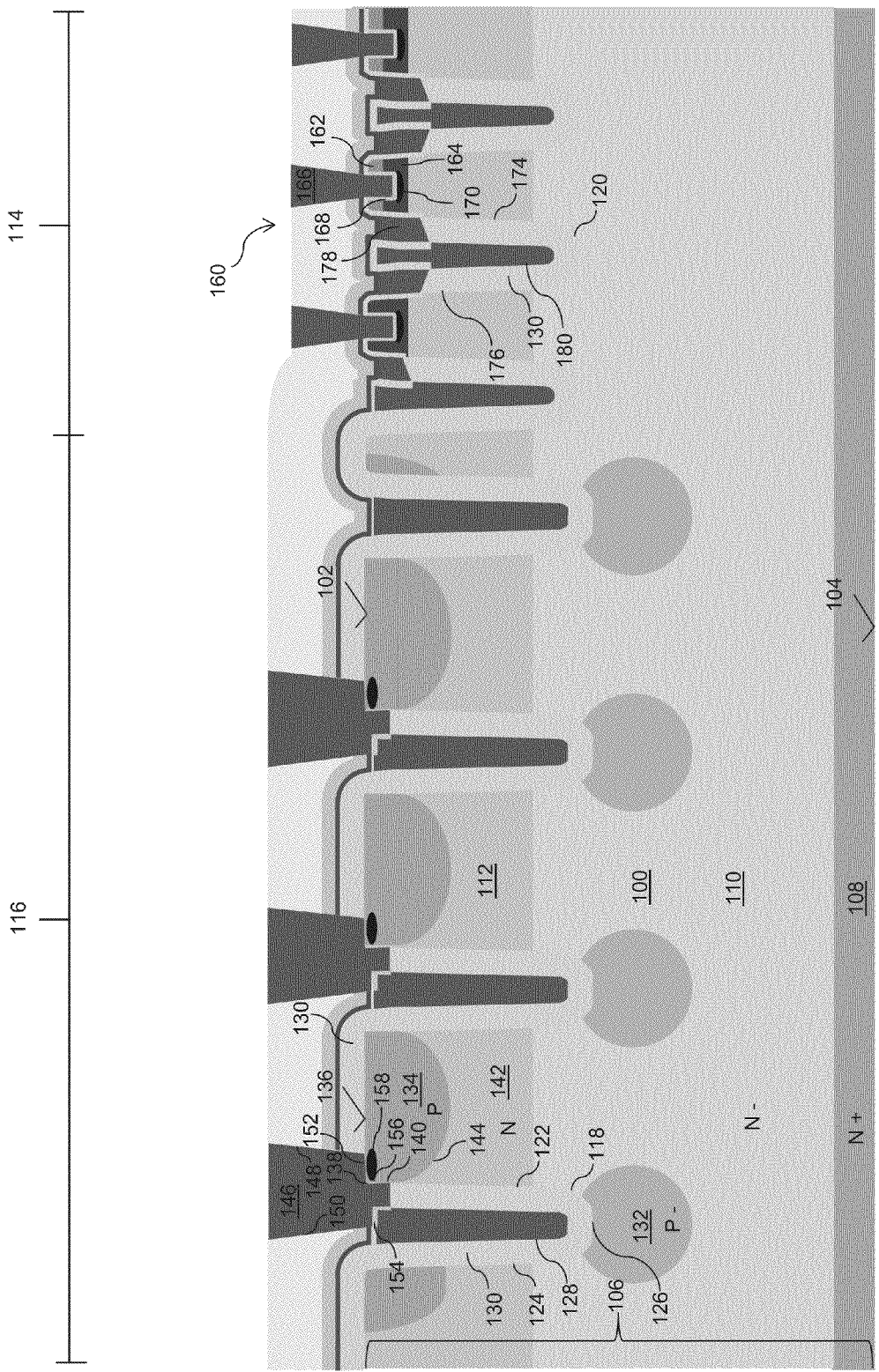
FIG. 2 illustrates a cross sectional view of the semiconductor device of FIG. 1, accounting for the effect of high temperature processing on the shape of a first doped region of the edge termination region.

Referring to FIG. 2, a semiconductor body 100 having the same features as the semiconductor body 100 of FIG. 1 and discussed above is shown. However, the first doped region 134 has been rearranged in a practical comparison to the ideal depiction shown in FIG. 1. The rearrangement of the first doped region 134 shown in FIG. 2 is at least partly attributable to high temperature processing effects, which impact the shape of the first doped region 134 and more particularly the p-n junction 144 formed with the second doped region 142. For instance, segregation effects attributable to oxidation of the dielectric 130 lower the effective doping of the first doped region 134 near the dielectric interface 130, leading to a decreased depth of the p-n junction 144 near the trench sidewall 122 than compared to the center of the first doped region 134. Thus, FIG. 2 depicts the p-n junction 144 formed by the first and second doped regions 134, 142 spaced closer to the first surface 102 adjacent the trench sidewall 122 that adjoins the first doped region 134 and spaced further from the first surface 102 at a distance from the edge termination trench 118. In other words, the lower boundary of the first doped region 134 is not perfectly parallel with the first surface 102, but rather curves towards the first surface as it approaches the edge termination trench 118.

For various reasons, the space charge region associated with the p-n junction 144 may extend substantially into the first doped region 134, towards the first surface 102. Design considerations, such as high breakdown requirements, may necessitate the first doped region 134 to be relatively lightly doped. The effective doping concentration of the first doped region 134 may be further lowered by phosphorous out-diffusion from the edge region contact 146 at high temperatures. Consequently, the doping concentration of the first doped region 134 may be significantly low relative to the doping concentration of the second doped region 142 such that the space charge region shifts into the first doped region 134, towards the first surface 102.

Certain processing steps may cause portions of the second interconnect 156 to move into the semiconductor body 100 towards the p-n junction 144. For instance, high temperature processing may cause the second interconnect 156 to diffuse into the semiconductor body 100 in this manner. One processing step involves introducing impurities, such as platinum (Pt), gold (Au), vanadium (V), iridium (Ir) or copper (Cu) into the active device region 114. This process step improves the robustness of the devices by decreasing carrier lifetime and hence decreasing current densities between the edge termination region 116 and the active device region 114 during reverse recovery. The impurities are typically diffused into the semiconductor body at extremely high temperatures. For instance, the thermal budget for an impurity diffusion process may be at or in excess of 980 degrees Celsius for ten minutes. This high thermal budget causes the material of the second interconnect 156 (e.g. TiSi) to migrate (i.e. diffuse) into the semiconductor body 100, away from the first surface 102 and towards the p-n junction 144.

The above described practical considerations create a high risk of electrical short across the p-n junction 144, particularly if the second interconnect 156 is formed in a recess of the semiconductor body 100. If second interconnect 156 material arranged in the first doped region 134 and along the trench sidewall 122 moves towards the p-n junction 144, and more particularly near the space charge region associated with the p-n junction 144, the risk that some of the material of the second interconnect 156 may short the p-n junction 144 increases. Electrical shorts across the p-n junction 144 provide a leakage path, and may dramatically increase off-state losses. Forming the second interconnect 156 in a recess of the semiconductor body 100 reduces the distance between the second interconnect 156 and the p-n junction 144 and hence increases this risk. If certain leakage requirements are exceeded, yield is reduced.

Advantageously, the arrangement of the edge region contact 146 and corresponding second interconnect 156 provides a maximum separation between the second interconnect 156 and the p-n junction 144, thus mitigating the possibility that the second interconnect 156 could electrically short the p-n junction 144. This is because, rather than having a recessed portion, the first doped region 134 has a planar outer surface 136 disposed along the first surface 102 that adjoins the edge termination trench 118. As will be explained in further detail below, this arrangement can be made possible by masking the single openings in the edge termination region 116, used to form the edge region contact 146, during a grove etch of the semiconductor body 100 in the active device area that is performed to make the source contact 166. Hence, the source contact 166 penetrates the first surface 102 whereas the edge region contact 146 does not penetrate the first surface 102 outside of the edge termination trench 118.

FIG. 3, which includes FIGS. 3A through 3G, illustrates an embodiment of a method of forming a semiconductor device in a semiconductor body 100. The semiconductor body is formed from first, second and third semiconductor layers 108, 110 and 112. The first semiconductor layer 108 is silicon substrate of the second conductivity type. The second semiconductor layer 110 may be epitaxially grown on the first semiconductor layer, and may be lightly doped with dopants of the second conductivity type. The third semiconductor layer 112 may be epitaxially grown on the second semiconductor layer 110, and may be more heavily doped than the second semiconductor layer 110 with dopants of the second conductivity type.

Active device trenches 120 and edge termination trenches 118 are formed in the semiconductor substrate 100 using conventional methods, such as etching. The active device trenches 120 are formed in the active device region 114 and the edge termination trenches 118 are formed in the edge termination region 116, respectively. If required, a rounding oxide can be grown and subsequently removed. In the edge termination region 116, first doped regions 134 are formed between adjacent ones of the edge termination trenches 118. The rounding oxide may serve as stray oxide if the first doped regions 134 are formed by implantation. In the active device region 114, the source and body regions 162, 164 are formed between adjacent ones of the active device trenches 120. The first doped regions 134, source regions 162 and body regions 164 may be formed using known doping techniques, such as diffusion or implantation. The first doped regions 134, source regions 162 and body regions 164 may be formed before or after formation of the edge termination and active device trenches 118, 120. The edge zones 132 may be formed using known doping techniques, such as diffusion or implantation of dopants into the bottom side 126 of the edge termination trenches 118.

The first doped regions 134 have a planar outer surface 136 disposed along the first surface 102 that adjoins one of the trench sidewalls 122 at the corner 138 of the trench sidewall and the first surface 102 and the side surface 140 extending from the corner 138 along the trench sidewall 122.

The dielectric 130 may be formed as a single layer of oxide that is grown in the active device trenches 120 and the edge termination trenches 118, as well as on the first surface 102. Edge termination electrodes 128 are formed in the edge termination trenches 118 between the dielectric 130. Gate electrodes 178 and field electrodes 180 are formed in the active device trenches 120 between dielectric 130. The edge termination electrodes 128, the gate electrodes 178 and the field electrodes 180 may be formed from highly doped polysilicon using known processes. According to an embodiment, the edge termination and active device trenches 118, 120 and the dielectric 130 are formed prior to the formation of the first doped regions 134, source regions 162 and body regions 164. This sequence advantageously mitigates substantial changes in the doping profile of the first doped regions 134, source regions 162 and body regions 164 due to segregation effects attributable to formation (e.g. oxidation) of the dielectric 130.

An interlayer dielectric 182 is provided over the dielectric 130. The interlayer dielectric 182 may be a multilayer structure that includes a silicon nitride layer 184, a molded silicon glass layer 186 and doped silicon glass layer 188, respectively. According to an embodiment, doped silicon glass layer 188 is a borophosphosilicate glass (BPSG).

An etch mask 190 is provided over the semiconductor body 100 and over the interlayer dielectric 182. The etch mask 190 may be made from a commonly used photo-resist material. The etch mask 190 includes edge region contact openings 192 and source contact openings 194. In the edge termination region 116, the edge region contact openings 192 are arranged so that one side of the edge region contact openings 192 overlaps with the edge termination electrodes 128, when seen from above, and the other side of the edge region contact openings 192 extends over the first doped region 134, away from the edge termination trench 118, when seen from above. The source contact openings 194 are arranged to be laterally confined to the source regions 162, when seen from above. The resulting structure is shown in FIG. 3A.

Figure 3B:
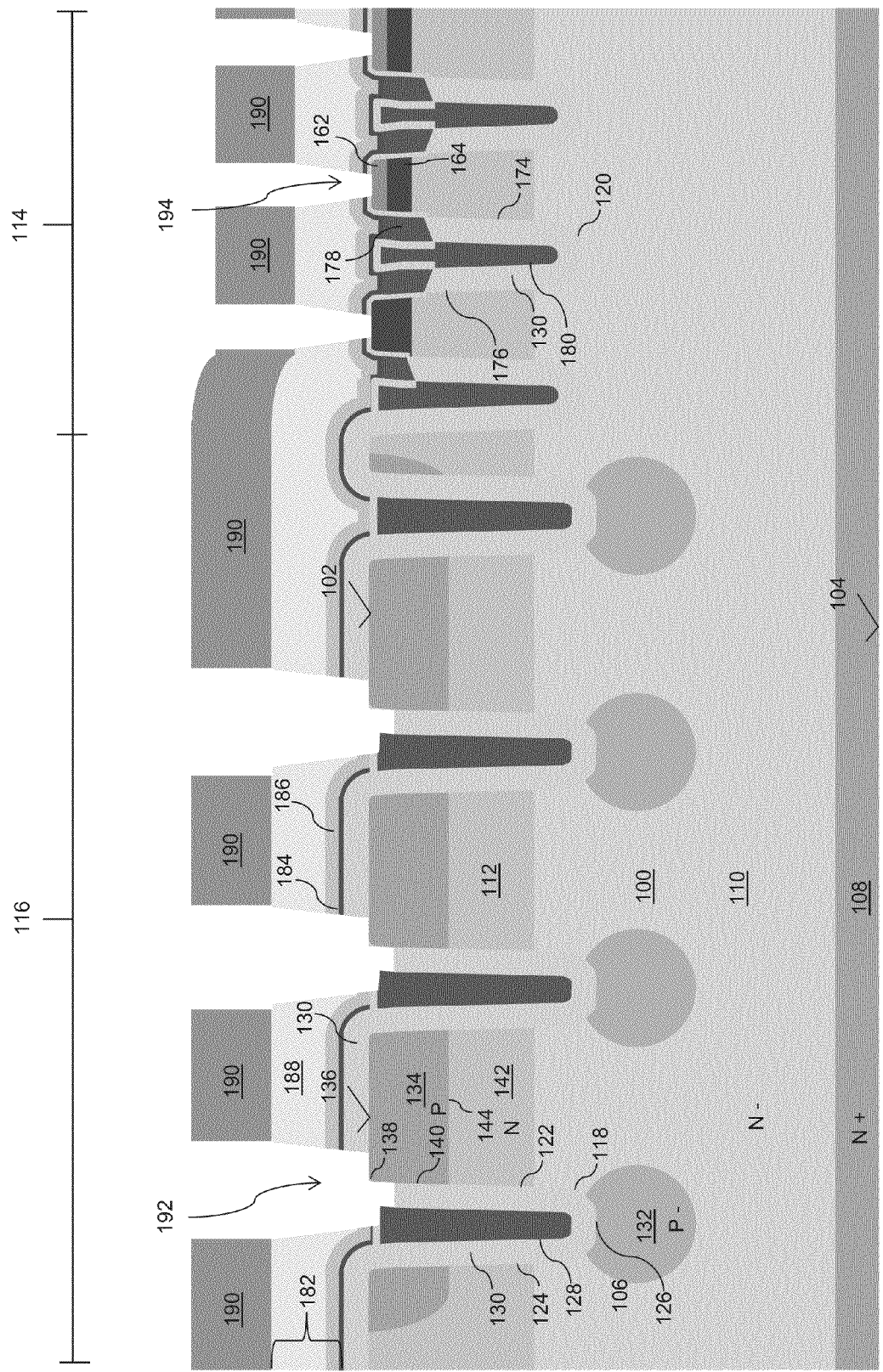

Referring to FIG. 3B, a contact etch is performed. During the contact etch, the interlayer dielectric 182 is etched. As a result of the etch, the edge region contact openings 192 extend through the interlayer dielectric 182 so that edge termination electrodes 128 are exposed. The contact etch is a selective etch so that the semiconductor body 100 is not etched during this step. Hence, the first doped region 134 maintains the planar outer surface 136 and adjoins the edge termination trench 118 at the corner 138. Portions of the dielectric 130 within the edge termination trenches 118 between the edge termination electrodes 128 and the trench sidewall 122 may be etched so that there is a recessed portion. The source contact openings 194 extend through the interlayer dielectric 182 so that the source regions 162 are exposed.

Figure 3C:
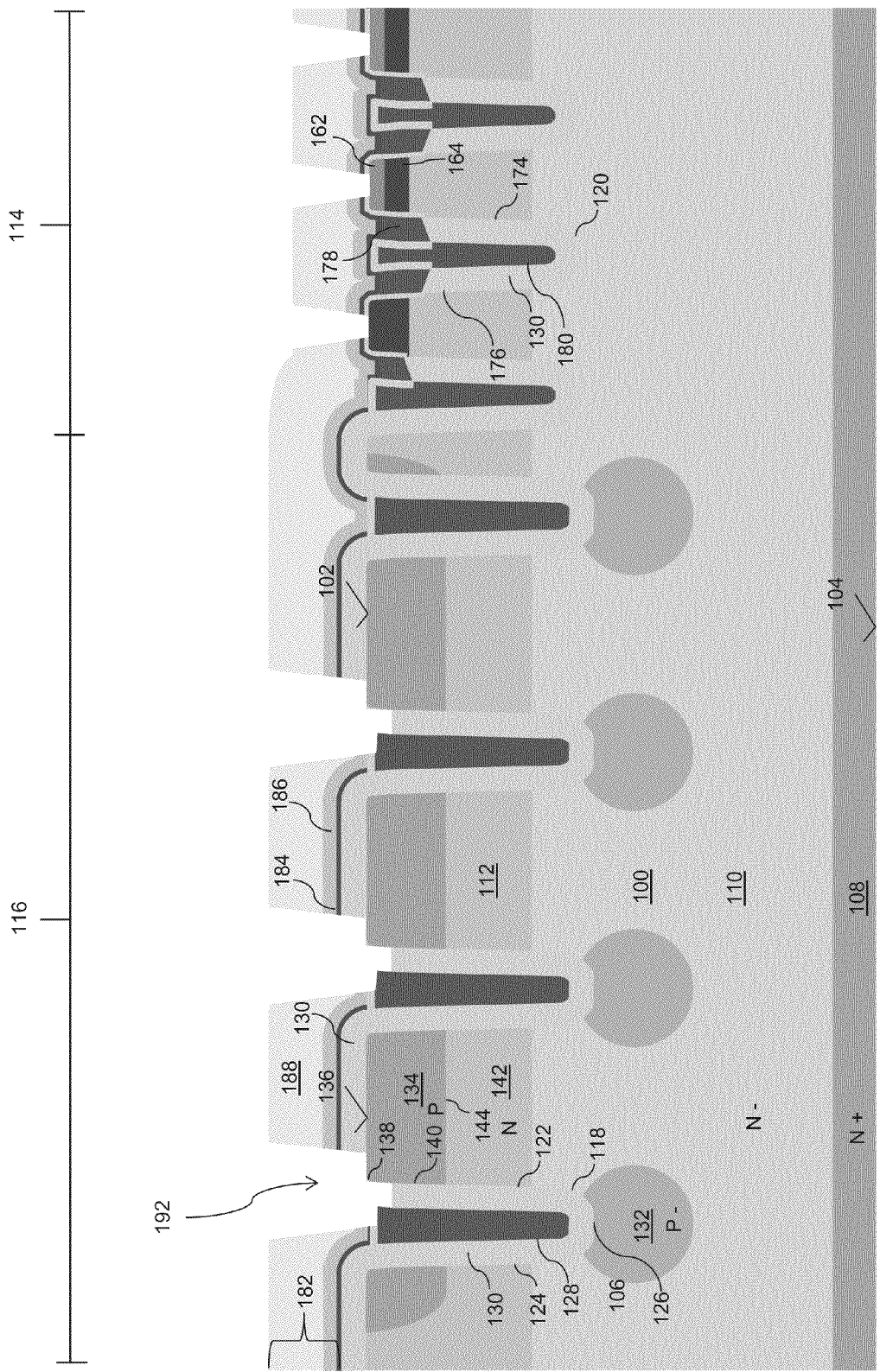

Referring to FIG. 3C, etch mask 190 is removed.

Figure 3D:
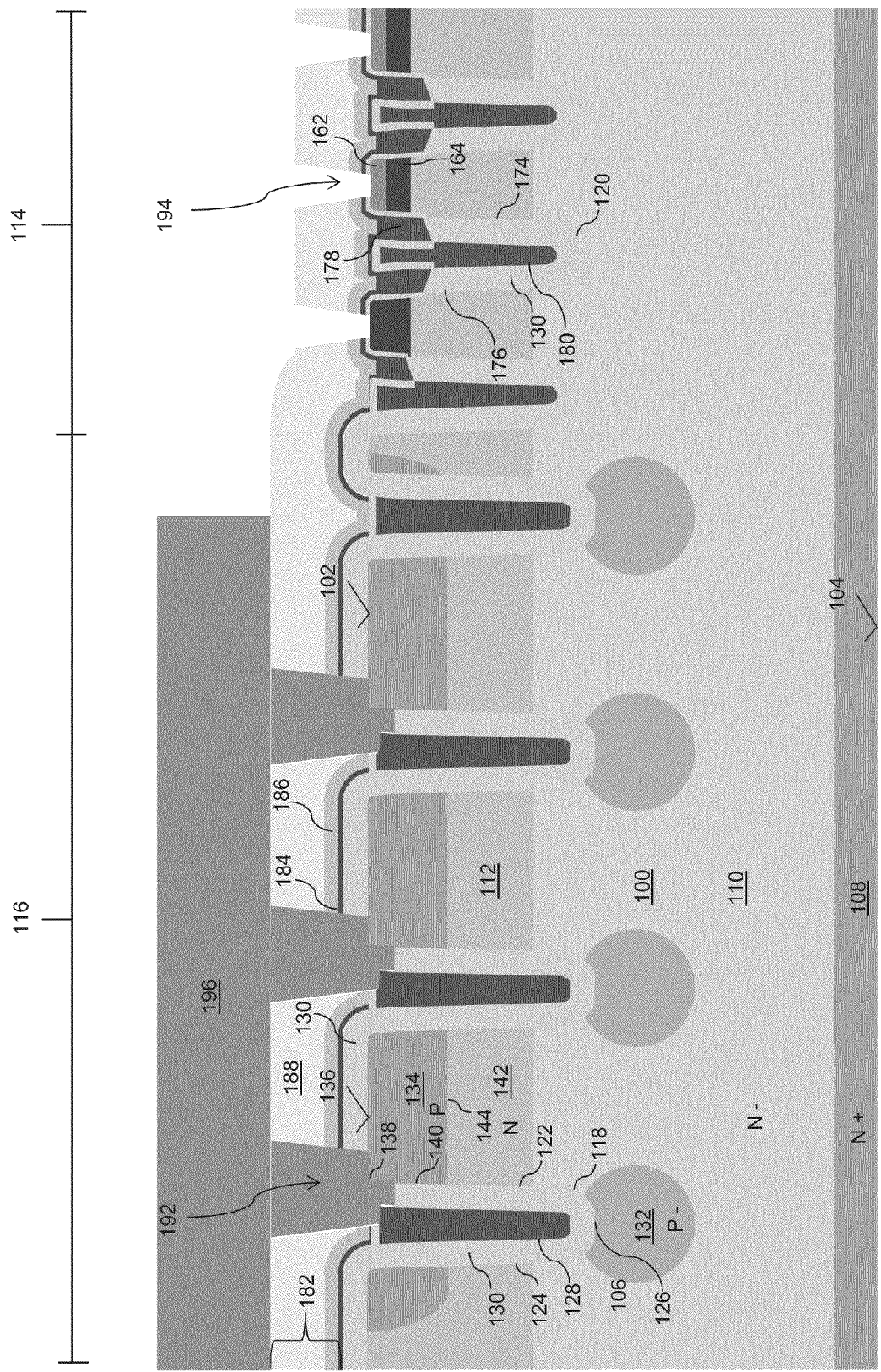

Referring to FIG. 3D, an edge region contact opening mask 196 is provided. The edge region contact opening mask 196 is provided in the edge termination region 116, but not in the active device region 114. The edge region contact opening mask 196 completely covers the edge region contact openings 192 but does not cover the source contact openings 194.

Figure 3E:
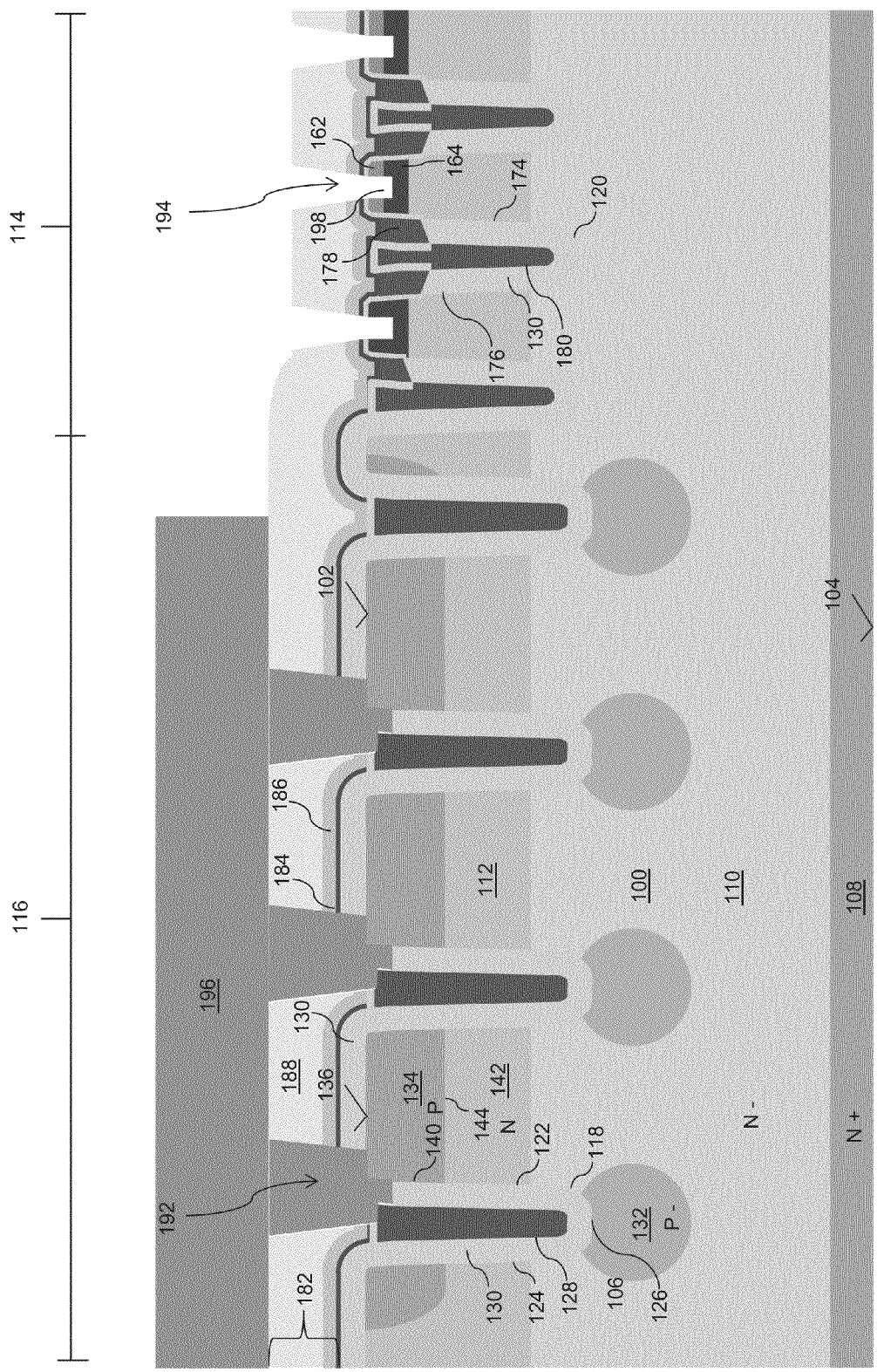

Referring to FIG. 3E, a groove etch is performed in the active device region 114. The groove etch is performed using the interlayer dielectric 182 and the dielectric 130 as an etch mask. The exposed silicon of the source regions 162 between the source contact openings 194 is etched to form contact grooves 198. The contact grooves 198 extend into the semiconductor body 100, beneath the surface 102.

Figure 3F:
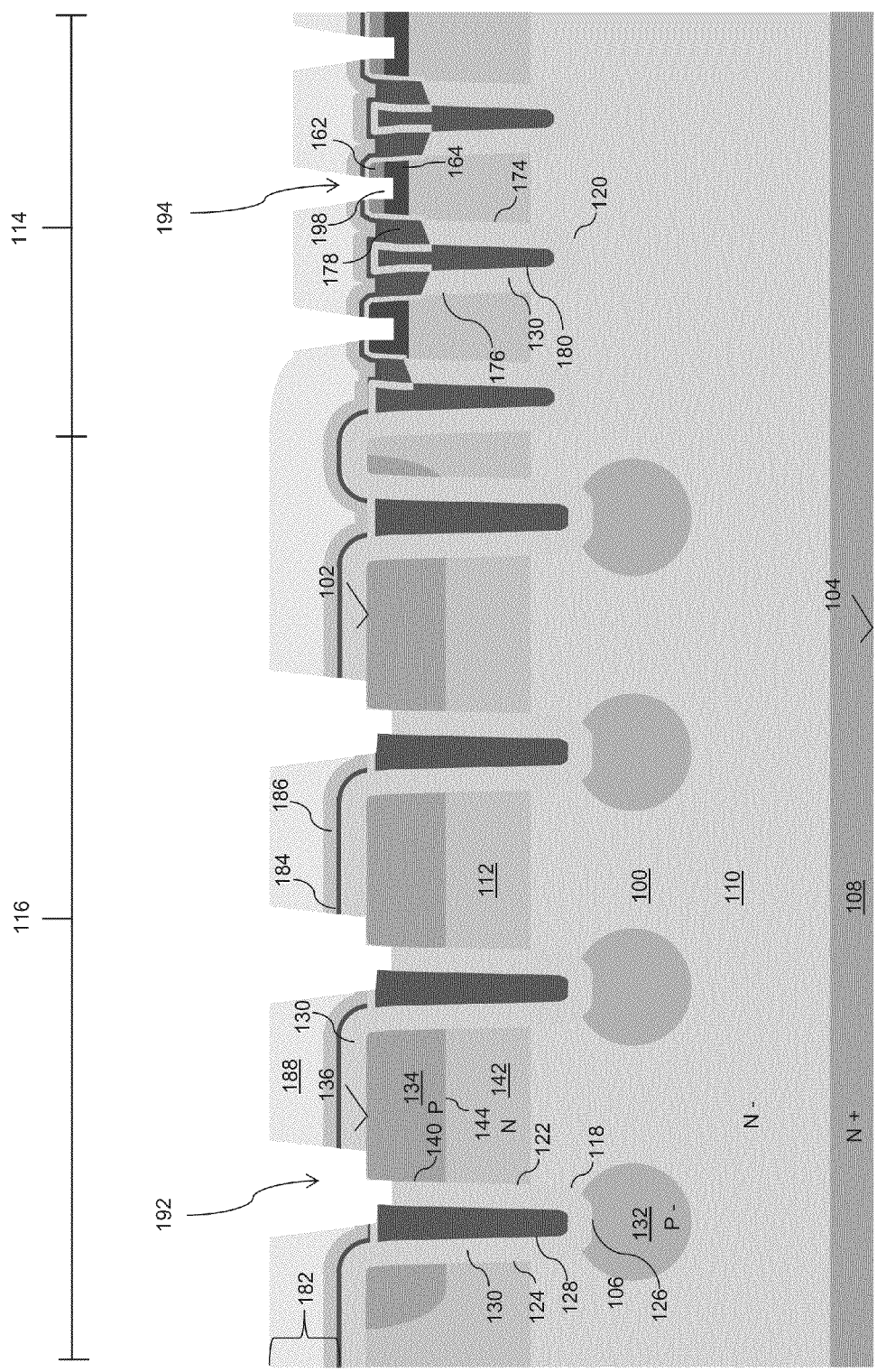

Referring to FIG. 3F, the edge termination opening mask 196 is removed. As a result, the edge region contact openings 192, the source contact openings 194 and the contact grooves 198 are exposed.

Figure 3G:
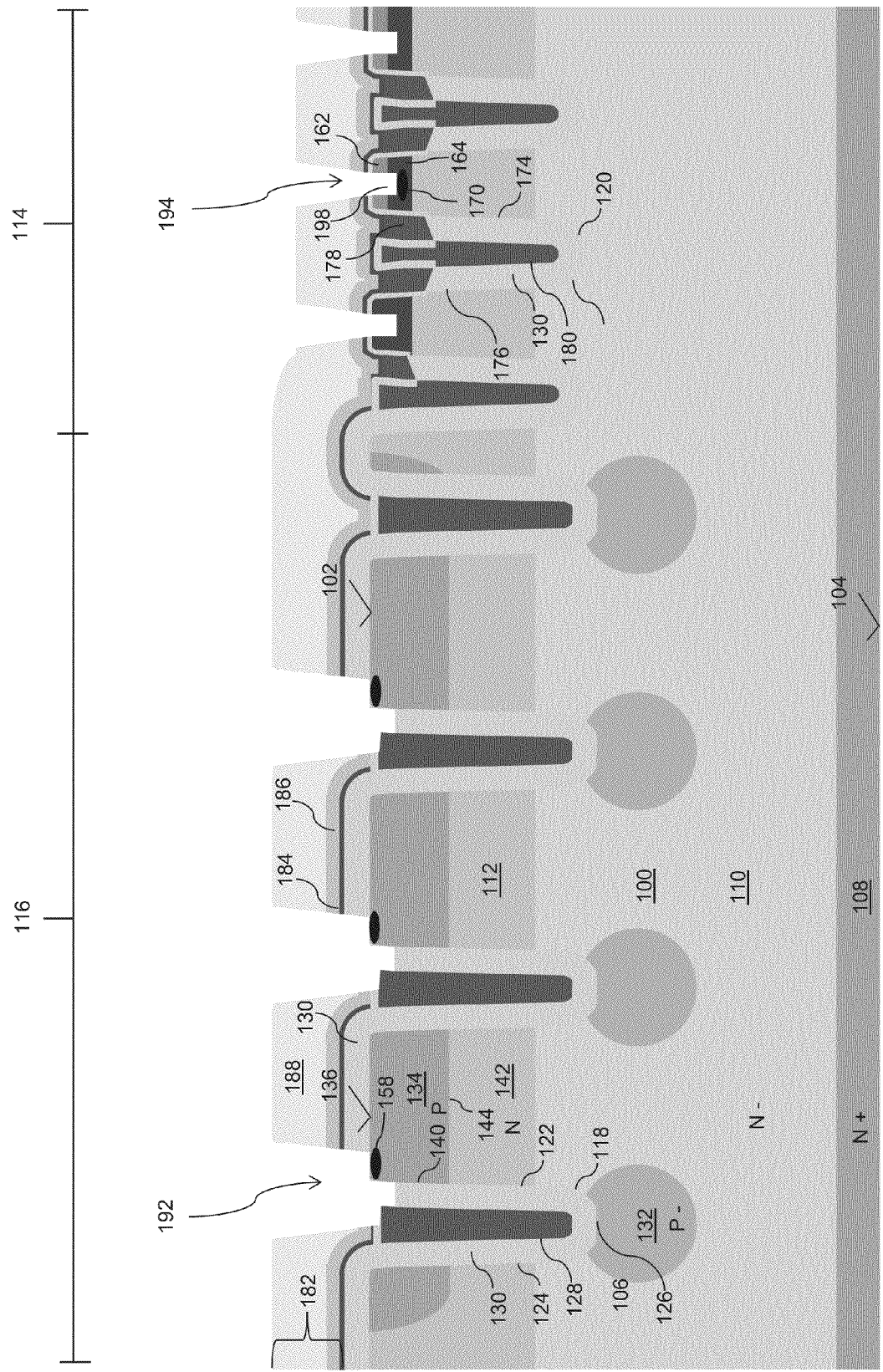

Referring to FIG. 3G, contact regions 158 are formed in the first doped regions 134. The contact regions 158 may be formed by implantation of first conductivity type dopants into the exposed portion of the first doped regions 134 at the first surface 102. Body contact regions 170 may also be formed in the body regions 164 by implantation of first conductivity type dopants into the contact grooves 198.

Figure 3H:
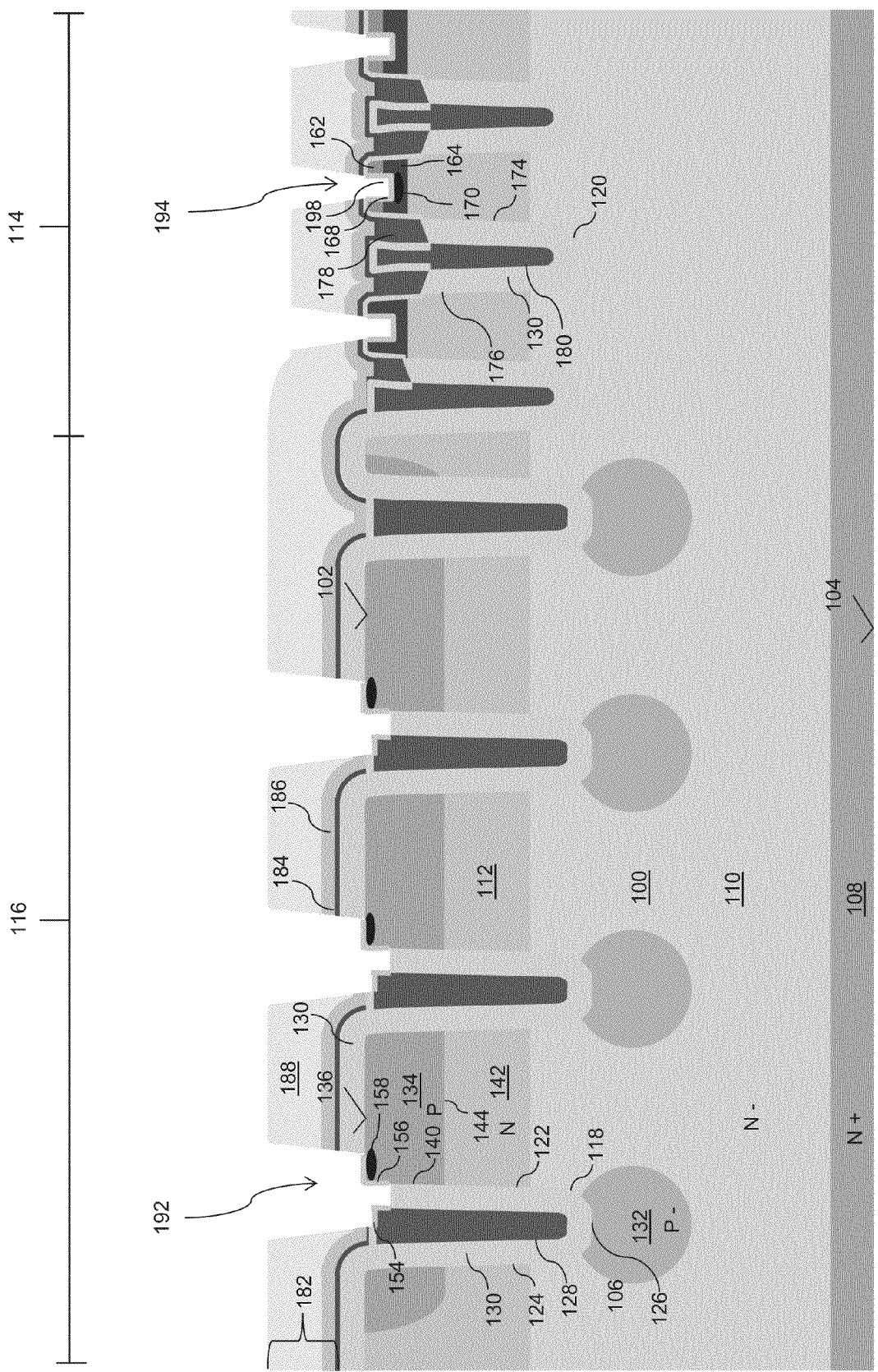

Referring to FIG. 3H, first and second interconnects 154, 156 are provided in the edge termination region 116. Additionally, third interconnects 168 are formed in the active device region 114. First, second and third interconnects 154, 156, 168 may be formed using a deposition process, for example. According to an embodiment, first, second and third interconnects 154, 156, 168 are formed by chemical vapor deposition (CVD) of a Titanium (Ti) or a titanium film and subsequent annealing of the film to form Titanium Silicide (TiSi). First and second interconnects 154, 156 are formed over the exposed silicon in the edge region contact openings 192. More particularly, the first interconnect 154 is formed by depositing titanium on top side and sidewall portions of the edge termination electrode 128 that are exposed from the dielectric 130. The second interconnect 156 is formed by depositing titanium on portions of the planar surface 136 and the side surface 140 of the first doped region 134 that are exposed from the dielectric 130.

Figure 3I:
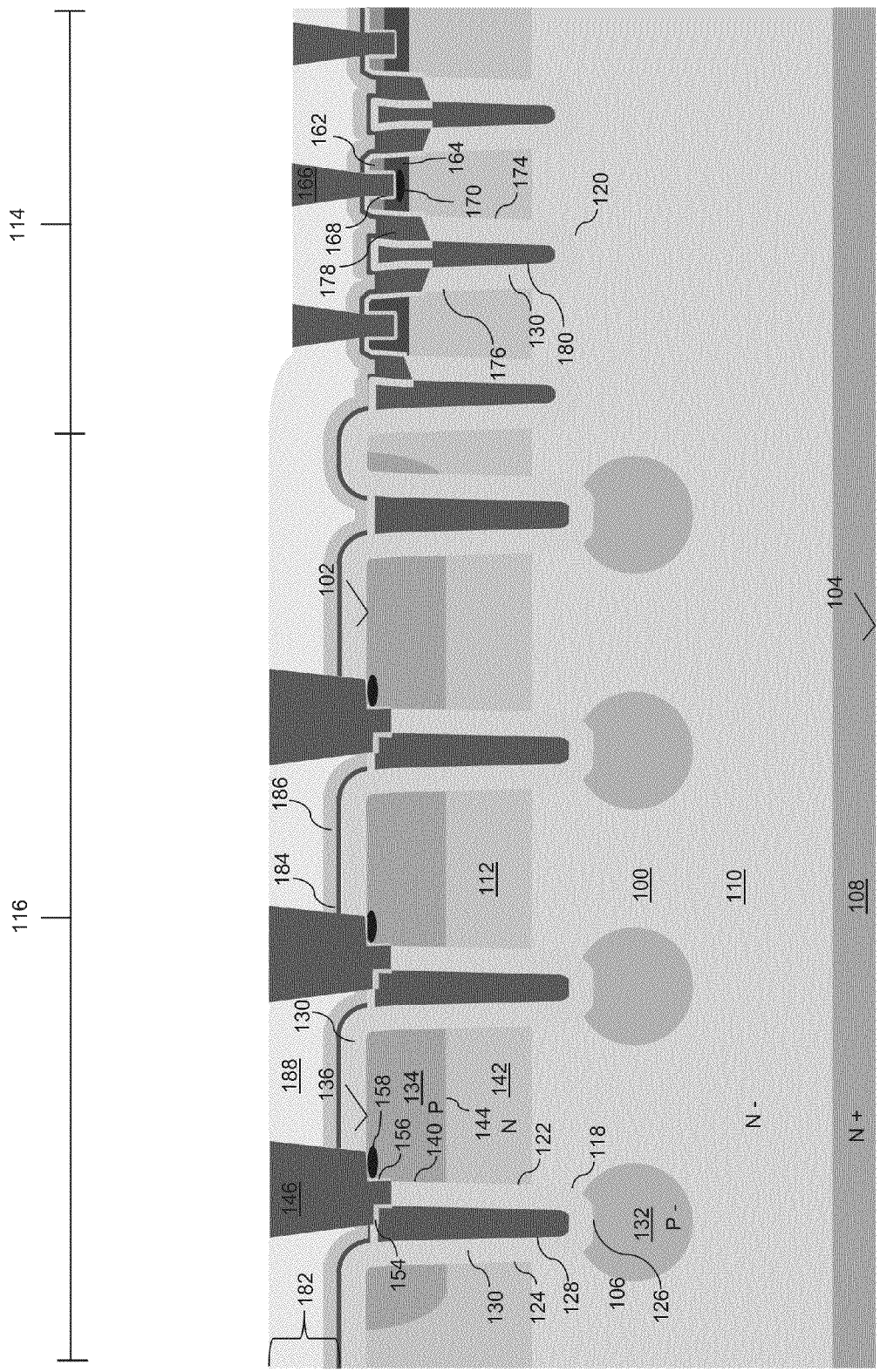

Referring to FIG. 3I, edge region contacts 146 are formed in the edge region contact openings 192. Source contacts 166 are formed in the source contact openings 194 and in the contact grooves 198. The edge region contacts 146 and source contacts 166 may be formed from highly doped polysilicon.

Advantageously, the aforementioned sequence provides source contacts 166 that are arranged in the grooves 198, beneath the first surface 102, and also provides edge region contacts 146 that do not penetrate the first surface 102 outside of the edge termination trenches 118. Formation of the source contacts 166 in the grooves 198 allows for a single electrical connection to the source and body regions 162, 164. However, the edge region contacts 146 are only provided for electrical connection between the edge termination electrode 128 and the first doped region 134. This electrical connection may be effectuated at the first surface 102. Hence, the disclosed process sequence avoids etching of the semiconductor material adjacent the edge termination trenches 118 and thus the contact surface of the first doped region 134 remains coplanar with the first surface 102. Consequently, the edge region contact 146 and subjacent second interconnect 156 are spaced further away from the p-n junction 144, which in turn reduces the possibility of shorting p-n junction 144 by the second interconnect 156.

Figure 3J:
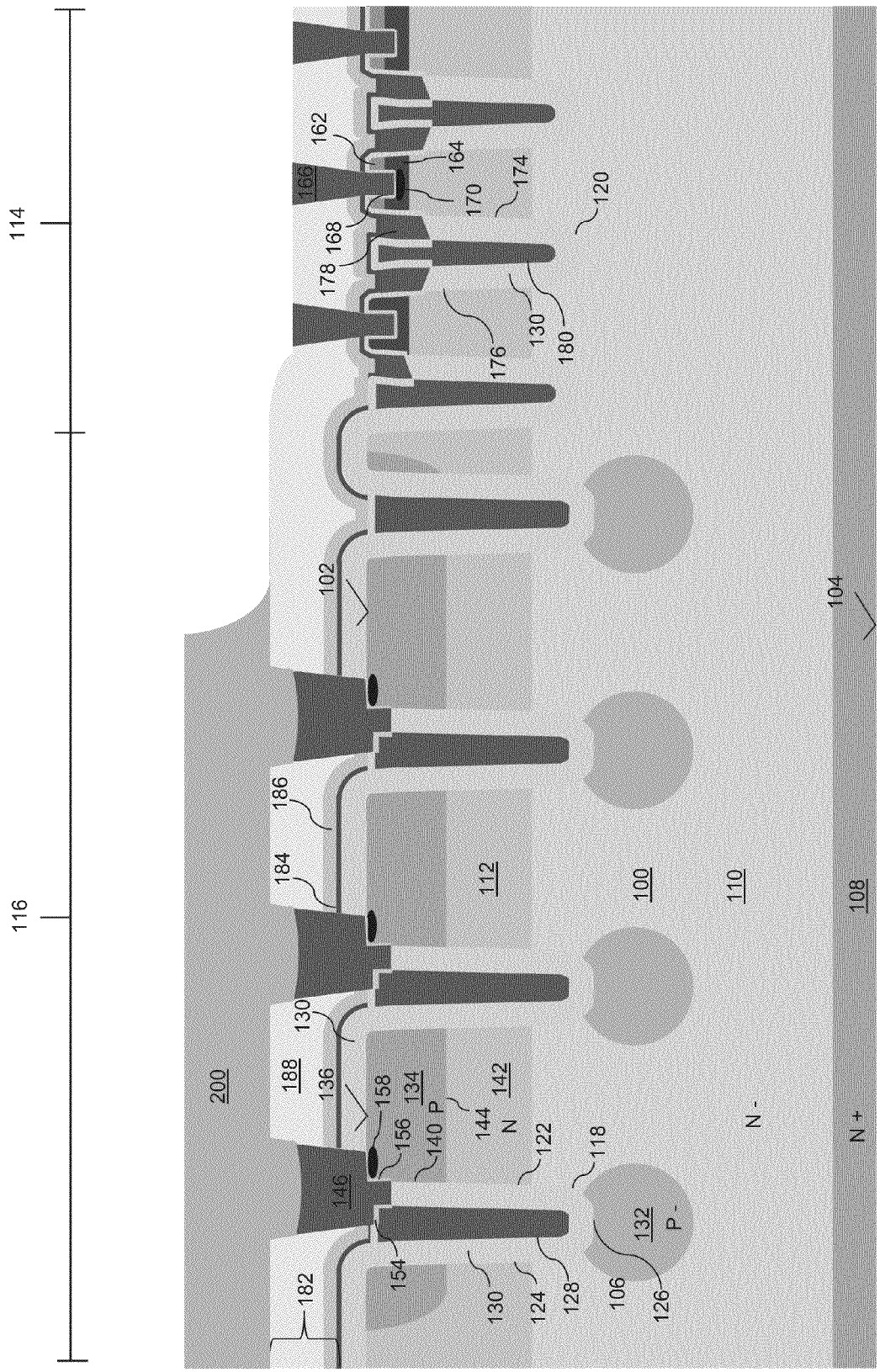

Referring to FIG. 3J, an isolation layer 200 is formed in the edge termination region 116. The isolation layer 200 completely covers the edge region contacts 146 but does not cover the source contacts 166 in the active device region 114. The isolation layer 200 may be formed from phosphosilicate glass (PSG). Initially, the isolation layer 200 is formed over both the active device region 114 and the edge termination region 116. Next, the isolation layer 200 is removed (e.g. etched) only in the active device region 114. If the doped silicon glass layer 188 is a boronphosphosilicate glass (BPSG), and the isolation layer 200 is a phosphosilicate glass (PSG), a chemical etch having a much higher etch rate of PSG as compared to BPSG may be performed on the isolation layer 200 in the active device region 114. This provides a kind of etch stop at the BPSG surface of the doped silicon glass layer 188. This advantageously eliminates the need for a stopping layer between the isolation layer 200 and the doped silicon glass layer 188.

Figure 3K:
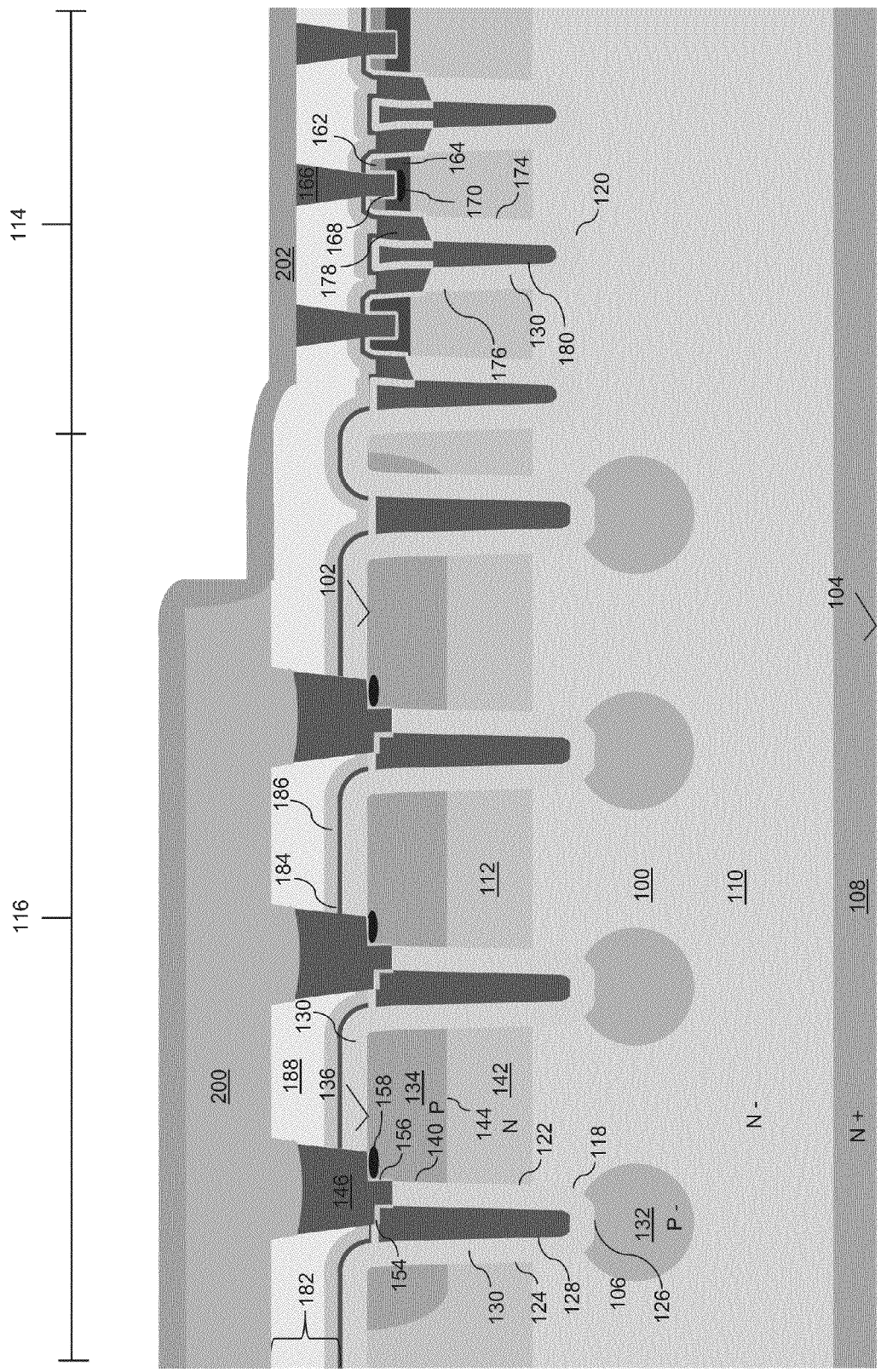

Referring to FIG. 3K, A metal layer 202 is provided over the semiconductor body 100. The metal layer 202 may be formed from platinum (Pt), gold (Au), vanadium (V), iridium (Ir) or copper (Cu), and the like. The metal layer 202 adjoins the source contacts 166 in the active device region 114.

Figure 3L:
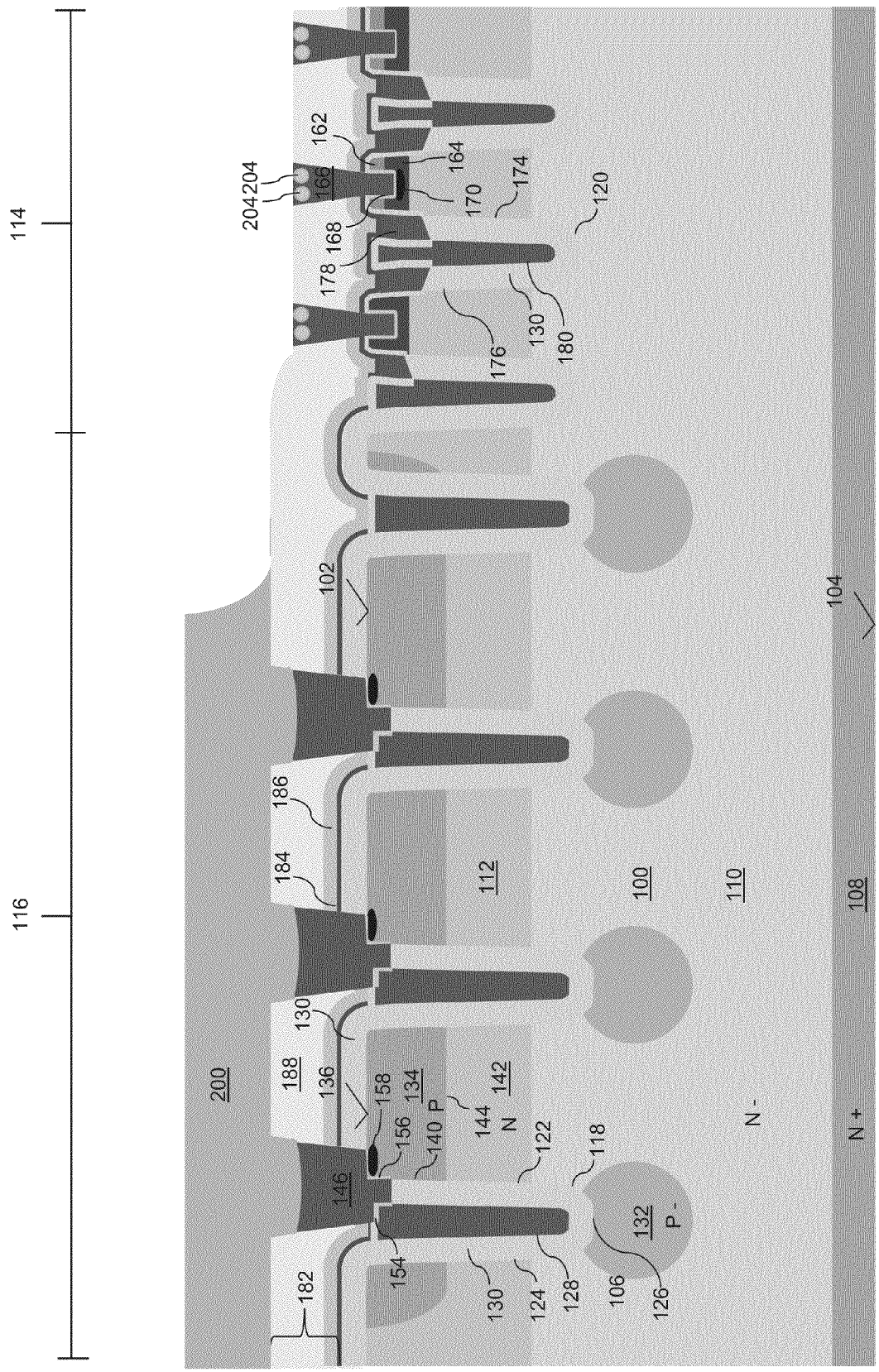

Referring to FIG. 3L, metal silicide structures 204 are formed at or in the source contacts 166. The metal silicide structures 204 are formed by causing the metal layer 202 arranged as depicted in FIG. 3K to react with polysilicon (or a similar material) of the source contacts to form a silicide. This silicidization step may be performed by exposing the metal layer 202 to a high temperature, such as 470 degrees Celsius. According to an embodiment, the metal layer 202 is substantially made of platinum (Pt) so that the resulting silicide structures 204 are platinum silicide (PtSi). Subsequently, the metal layer 202 is removed. Because the isolation layer 200 is present during silicidization, the edge region contacts 146 in the edge termination region 116 are devoid of (i.e. do not contain) any metal silicide structures 204. Subsequently, a drive in process may be performed whereby metals from the metal silicide structures 204, such as platinum, are diffused into the semiconductor body 100 in the active device region 114. The drive in process may be a high-temperature process having a thermal budget at or in excess of 980 degrees Celsius for ten minutes. Subsequently, the metal silicide structures 204 may be removed from the source contacts 166.

Spatially relative terms such as "under," "above," "below," "lower," "over," "upper" "top," "bottom," "beneath" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

The figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

What is claimed is:

1. A semiconductor device, comprising:
   a semiconductor body comprising a first surface, a second surface opposite the first surface, an edge extending between the first and second surfaces, an active device region spaced inward from the edge and comprising at least one active semiconductor device, and an edge termination region between the active device region and the edge;
   a trench extending from the first surface into the semiconductor body in the edge termination region, the trench comprising sidewalls and an electrode insulated from the surrounding semiconductor body;
   a first doped region of a first conductivity type extending from the first surface into the semiconductor body in the edge termination region, the first doped region having a planar outer surface disposed along the first surface that adjoins the trench at a corner of one of the trench sidewalls and the first surface and having a side surface extending from the corner along the trench sidewall;
   a first interconnect contacting the trench electrode;
   a second interconnect contacting the outer surface and the side surface of the first doped region; and
   an edge region contact contacting the first and second interconnects and electrically coupling the first doped region to the trench electrode, the edge region contact having a bottom surface that is coplanar with the first surface from an edge of the edge region contact to the corner.

2. The semiconductor device of claim 1, wherein the second interconnect comprises at least one of titanium silicide and titanium.

3. The semiconductor device of claim 1, further comprising:
   a second doped region of a second conductivity type that is opposite the first conductivity type, the second doped region adjoining the first doped region below the first doped region to form a p-n junction that extends beneath the first surface and terminates at the trench sidewall that adjoins the first doped region.

4. The semiconductor device of claim 3, wherein the p-n junction is spaced closer to the first surface adjacent the trench sidewall that adjoins the first doped region and spaced further apart from the first surface between at a distance from the trench sidewall.

5. The semiconductor device of claim 1, wherein the first doped region comprises a contact region of a first conductivity type that is more heavily doped than a surrounding portion of the first doped region, the contact region arranged between the second interconnect and the surrounding portion of the first doped region.

6. The semiconductor device of claim 1, further comprising a plurality of trenches, wherein the planar surface of the first doped region extends between adjacent ones of the trenches.

7. The semiconductor device of claim 1, further comprising a dielectric layer on the first surface of the semiconductor body, wherein the edge region contact is disposed in a single opening in the dielectric layer over the first doped region and the trench electrode.

8. The semiconductor device of claim 7, wherein the dielectric layer is in the trench and insulates the electrode from the surrounding semiconductor body, and wherein a single opening forms a recess in the dielectric layer between the electrode and one of the trench sidewalls such that the edge region contact extends beneath the first surface in the recess.

9. The semiconductor device of claim 1, further comprising:
   a source contact in the active device region electrically connected to a source region of the at least one semiconductor device;
   wherein the source contact comprises platinum silicide, and
   wherein the edge region contact does not comprise platinum silicide.

10. A method of forming a semiconductor device in a semiconductor body comprising a first surface, a second surface opposite the first surface, an edge extending between the first and second surfaces, an active device region spaced inward from the edge and comprising at least one active semiconductor device, and an edge termination region between the active device region and the edge, the method comprising:
    forming a trench extending from the first surface into the semiconductor body in the edge termination region, the trench comprising sidewalls and an electrode insulated from the surrounding semiconductor body;
    forming a first doped region of a first conductivity type extending from the first surface into the semiconductor body in the edge termination region, the first doped region having a planar surface disposed along the first surface that adjoins one of the trench sidewalls at a corner of the trench sidewall and the first surface and a side surface extending from the corner along the trench sidewall;
    forming a first interconnect contacting the trench electrode;
    forming a second interconnect contacting the outer surface and the side surface of the first doped region; and
    forming an edge region contact adjacent to the first and second interconnects and electrically coupling the first doped region to the trench electrode, the edge region contact having a bottom surface that is coplanar with the first surface from an edge of the edge region contact to the corner.

11. The method of claim 10, further comprising,
    masking the edge termination region; and
    etching a contact groove into the semiconductor body in the active device region while the edge termination region is masked such that the first doped region is protected from the etching of the contact groove and maintains a planar surface disposed along the first surface that adjoins one of the trench sidewalls at a corner of the trench sidewall and the first surface.

12. The method of claim 10, wherein forming the second interconnect comprises depositing at least one of titanium silicide and titanium.

13. The method of claim 10, further comprising:
    forming a second doped region of a second conductivity type that is opposite the first conductivity type, the second doped region adjoining the first doped region below the first doped region to form a p-n junction that extends beneath the first surface and terminates at the trench sidewall that adjoins the first doped region.

14. The method of claim 10, further comprising:
implanting dopants of the a first conductivity type in the first doped region to form a contact region that is more heavily doped than a surrounding portion of the first doped region, the contact region arranged between the second interconnect and the surrounding portion of the first doped region.

15. The method of claim 10, further comprising:
forming a plurality of trenches, wherein the planar surface of the first doped region extends between adjacent ones of the trenches.

16. The method of claim 10, further comprising:
forming a dielectric layer on the first surface of the semiconductor body;
etching a single opening in the dielectric layer over the first doped region and the trench electrode; and
forming the edge region contact in the opening.

17. The method of claim 16, wherein forming the first interconnect comprises depositing a conductive material on top side and sidewall portions of the electrode that are exposed from the dielectric layer, and wherein forming the second interconnect comprises depositing the conductive material on portions of the planar surface and side surface of the first doped region that are exposed from the dielectric layer.

18. The method of claim 17, wherein the dielectric layer is formed in the trench and insulates the electrode from the surrounding semiconductor body, wherein etching the single opening comprises forming a recess in the dielectric layer beneath the first surface between the electrode and one of the trench sidewalls, and wherein forming the edge region contact comprises depositing polysilicon over the first interconnect, the second interconnect and in the recess.

19. The method of claim 10, further comprising:
forming a source contact in the active device region electrically connected to a source region of the at least one semiconductor device;
forming an isolation layer in the edge termination region over the edge region contact;
providing a metal containing layer over the source contact; and
forming a metal silicide structure in the source contact without forming metal silicide in the edge region contact.

20. The method of claim 19, wherein the metal containing comprises platinum, and wherein the metal silicide structure comprises platinum silicide, the method further comprising:
performing a high temperature drive-in process that causes platinum to diffuse from the metal silicide structure into the semiconductor body in the active device area.

* * * * *